United States Patent [19]

Matsumoto et al.

[11] Patent Number: 4,983,318
[45] Date of Patent: Jan. 8, 1991

[54] METHOD FOR ELECTRIC FIELD ORIENTATION OF LIQUID CRYSTAL POLYMERS AND ORIENTED MATERIALS OF LIQUID CRYSTAL POLYMERS OBTAINED BY THE METHOD

[75] Inventors: Mitsuo Matsumoto; Kiyoto Ohtsuka; Koichi Sato, all of Kurashiki; Takuji Okaya, Nagaokakyo, all of Japan

[73] Assignee: Kuraray Co., Ltd., Kurashiki, Japan

[21] Appl. No.: 201,860

[22] Filed: Jun. 3, 1988

[30] Foreign Application Priority Data

Jun. 3, 1987 [JP] Japan .................................. 62-140311
Mar. 9, 1988 [JP] Japan .................................. 63-57134

[51] Int. Cl.$^5$ .................... C09K 19/52; F21V 9/00; G02B 5/02
[52] U.S. Cl. .................................. 252/299.01; 428/1; 252/582; 252/587
[58] Field of Search ............... 252/582, 583, 589, 587, 252/299.01, 299.5, 299.4, 299.6, 299.61, 299.62, 299.63, 299.64, 299.65, 299.66, 299.67, 299.68, 299.7; 428/1

[56] References Cited

U.S. PATENT DOCUMENTS

| | | | |
|---|---|---|---|
| 4,624,872 | 11/1986 | Stuetz | 428/1 |
| 4,694,066 | 9/1987 | De Martino et al. | 528/373 |
| 4,779,961 | 10/1988 | De Martino | 350/350 R |
| 4,826,950 | 5/1989 | De Martino | 528/292 |

OTHER PUBLICATIONS

Meredith G. R. et al. Macromolecules 15, 1385, 1982.
Day, G. W. et al., Appl. Phys. Lett. 24, 456, 1974.
Die Makromolekulare Chemie Rapid Communications, vol. 2, p. 305 (1981).
Die Makromolekulare Chemie Rapid Communications, vol. 183, p. 1245 (1982).
Polymer Communications, vol. 24, p. 364 (1983).

Primary Examiner—Robert L. Stoll
Assistant Examiner—Richard Treanor
Attorney, Agent, or Firm—Oblon, Spivak, McClelland, Maier & Neustadt

[57] ABSTRACT

This invention relates to a method for electric field orientation of liquid crystal polymers and oriented materials of liquid crystal polymers obtained by the method. This electric field orientation method comprises applying a pulsating electric field which is predominantly unidirectional and whose magnitude is varying periodically or non-periodically to a liquid crystal polymer capable of forming an optically anisotropic melt phase. The oriented material of liquid crystal polymer thus obtained has been unidirectionally oriented and polarized. This oriented, polarized material of liquid crystal polymer can be utilized as a piezoelectric material, pyroelectric material, electret material, non-linear optical element or the like.

25 Claims, 5 Drawing Sheets

METHOD FOR ELECTRIC FIELD ORIENTATION OF LIQUID CRYSTAL POLYMERS AND ORIENTED MATERIALS OF LIQUID CRYSTAL POLYMERS OBTAINED BY THE METHOD

BACKGROUND OF THE INVENTION

1. Field of the Invention

The present invention relates to a method for a novel electric field orientation of liquid crystal polymers and oriented materials of liquid crystal polymers, obtained by the method. The polarized high molecular liquid crystal materials obtainable by the method of the invention can be utilized as piezoelectric materials, pyroelectric materials, electret materials, non-linear optical elements and so on.

2. Brief Description of the Prior Art

Liquid crystal polymers capable of forming an optically anisotropic melt phase, which are known commonly as thermotropic liquid crystal polymers, are roughly grouped into a class of main chain liquid crystal polymers in which a rigid molecule such as a benzene ring, biphenyl ring or naphthalene ring constitutes the main chain skeleton and a class of side chain liquid crystal polymers in which a liquid crystal-forming molecule called 'mesogen' is bound to a flexible skeletal polymer through a spacer group. The side chain liquid crystal polymers are such that the liquid crystal properties of monomeric or low molecular liquid crystals have been supplemented with the properties of polymers and, as such, promise usage as various functional materials. Thus, a side chain liquid crystal polymer in molten state undergoes change in orientation upon application of an external field such as an electric field or a magnetic field and retains the acquired orientation when its temperature is decreased with the application of the external field being continued. Therefore, the possibilities of utilizing such compounds as information storages, temperature indicating materials and so on have been suggested. For example, it is described in Japanese Laid-open Patent Publication No. 60-114823 (1985) and U.S. Pat. No. 4,702,558 that a side chain liquid crystal polymer having a siloxane backbone undergoes change in the state of orientation upon application of a direct or alternating electric field in the neighborhood of the transition temperature from the optically anisotropic melt phase to the isotropic melt phase and that since particularly a unidirectionally oriented optically transparent state can be achieved by applying an alternating electric field, this material can be applied to information storage devices. It is shown in Die Makromolekulare Chemie Rapid Communications 2, 305, (1981) and Polymer Communications 24, 364, (1983) that Shibaev et al. obtained a uniformly oriented "homeotropic" transparent film by applying an alternating electric field to a side chain liquid crystal polymer having a polymethacrylate backbone and that information can be recorded in the film by local heating of the film by means of, say, a laser beam, so as to disturb the state of orientation.

Furthermore, it is mentioned in Japanese Laid-open Patent Publication No. 61-69039 (1986) and U.S. Pat. No. 4,624,872 that when an exclusively aromatic thermotropic liquid crystal polymer film is exposed to a direct electric field, the liquid crystal molecules are oriented perpendicularly with respect to the film plane, thus permitting use of the film as a non-linear optical element.

It is, thus, known that as a DC or AC field is applied to a thermotropic liquid crystal polymer film, the liquid crystal molecules undergo movement to induce a change in the state of their orientation. However, while an optically transparent homeotropic film comprising liquid crystal molecules aligned in one direction can be obtained by application of an AC field, the resulting oriented film is also oriented about the center of symmetry and not polarized, apparently because of the electrical symmetry of the AC field. For example, according to the investigation conducted by the present inventors, the oriented film obtained by subjecting a 20 $\mu$m-thick film of a polymer of the following formula (I) to an AC field at a frequency of 3.5 KHz and 500 Vrms at a temperature of 90° C. and quenching it to room temperature without removal of the AC field was transparent and did not transmit light at all when observed under a polarizing microscope using a crossed Nicol prism.

However, when the surface charge of this oriented film was measured with a static meter, the film surface was found to have not been charged at all. No generation of an electric potential was found, either, when the piezoelectric property of the film was estimated by applying a certain impact to the film and measuring the generated voltage in accordance with the method described hereinafter in the working examples. These findings also suggest that the side chain moieties of the oriented film obtained by application of an AC field are disposed about the center of symmetry. This symmetric orientation is sufficient and useful for information recording applications such that the homeotropic oriented film is locally heated by a laser emission or the like to induce a change in orientation and this change is read from the resultant change in the reflection of light or for such applications as temperature sensors in which temperature-dependent optical changes in the state of orientation are utilized. However, such a non-polarized oriented film cannot be expected to be applied to the another polyfunctional materials in, for example, piezoelectric or pyroelectric materials.

On the other hand, there remains the possibility of obtaining a polarized oriented film by the application of a DC field. However, it is known that liquid crystal polymers and particularly molecules of a side chain liquid crystal polymer generally can be provoked to move but be hardly oriented uniformly by application of a DC field. It has been reported in the above-cited Japanese Laid-open Patent Publication No. 60-114823 (1985), U.S. Pat. No. 4,702,558, and Polymer 26, 1801 (1985), for instance, that when a DC field or an AC field of 300 Hz or less is applied to a side chain polymeric liquid crystal compound having a siloxane backbone, a turbulence is generated so that a uniformly oriented film cannot be obtained. According to the present inventors' exploration in which a 20 μm-thick film of a liquid crystal polymer of the above formula (I) is subjected to a DC field at a voltage up to 2000 V at 90° C., a turbulence was generated attesting to the movement of liquid crystal molecules but it was not possible to obtain an optically transparent film of uniformly oriented liquid crystal molecules.

Die Makromolekulare Chemie 183, 1245 (1982) also mentions that liquid crystal polymers are not uniformly oriented by a DC field or a low-frequency AC field.

Thus, by any of the hitherto-reported methods for orienting liquid crystal polymers with the use of an electric field, it is impossible to obtain a uniformly oriented, polarized film and these methods had limits for the development of functional materials exploiting liquid crystal polymers.

OBJECT OF THE INVENTION

It is an object of the invention to provide an electric field orientation method for liquid crystal polymers which is suitable for the production of shaped articles, such as film, in which the liquid crystal molecules have been uniformly oriented and polarized

SUMMARY OF THE INVENTION

The above-mentioned object is accomplished by subjecting a liquid crystal polymer capable of forming an optically anisotropic melt phase to a pulsating electric field which is predominantly unidirectional and whose magnitude varies either periodically or non-periodically.

The liquid crystal polymer used in the practice of the invention is a polymer capable of forming an optically anisotropic melt phase, the so-called thermotropic liquid crystal polymer. The term 'polymer capable of forming an optically anisotropic melt phase' means a polymer such that, when a specimen of the polymer in molten state is observed with a polarizing microscope equipped with a heater unit via a crossed Nicol prism, it transmits the incident light. In the practice of the invention, both the main chain liquid crystal polymer and the side chain liquid crystal polymer can be employed but the side chain liquid crystal polymer is usually preferred, for it undergoes change in the state of orientation more readily on application of a pulsating electric field As specific examples of the main chain liquid crystal polymers which can be used in the practice of the invention, there may be mentioned the known thermotropic liquid crystal polyesters and thermotropic liquid crystal polyester amides which can be obtained by polymerization of the compounds (1) through (4) given below and the derivatives thereof. However, there is a certain appropriate range for the combination and proportions of respective starting compounds for liquid crystal polymers (1) Aromatic or aliphatic dihydroxy compounds wherein Xs are the same or different and each represents hydrogen, halogen, cyano, alkyl, alkoxy, phenyl, phenoxy or the like; n and m each is equal to 0 or 1; Y is —O—, —CH$_2$—, —S— or the like.

wherein R is an alkyl group of 2 to 12 carbon atoms, which may optionally be branched.

(2) Aromatic or aliphatic dicarboxylic acids

HOOC(CH$_2$)$_n$COOH (n is an integer equal to 2 through 12.)

(3) Aromatic hydroxycarboxylic acids wherein Xs may be the same or different or each represents hydrogen, halogen, cyano, alkyl, alkoxy, phenyl, phenoxy or the like; and n is equal to 0 or 1.

(4) Aromatic diamines, aromatic hydroxylamines, and aromatic aminocarboxylic acids

As specific examples of main chain liquid crystal polymers which can be obtained from the above starting compounds, there may be mentioned polymers having the following structural units.

-continued copolymer copolymer copolymer copolymer copolymer

In the above structural formulas, X represents H, Cl, Br, CN, alkyl, alkoxy, phenyl, phenoxy or the like.

For the production of a liquid crystal, there are certain limits to the suitable proportions and molecular weights of respective copolymers.

The side chain liquid crystal polymer used in the practice of the invention is a polymer which consists of a flexible skeletal structure, such as an acryl, methacryl, siloxane, vinyl ether or the like nucleus and a rigid group such as a preferably substituted phenyl or biphenyl group or a phenyliminomethylbenzene group as attached to said skeletal structure by an ether or ester bond or the like through a spacer group which is generally a hydrocarbon group containing about 3 to 20 methylene units. As specific examples, compounds having the following repeating units can be mentioned. It should be understood that the following compounds include copolymers containing two or more different repeating units.

(1) Polyacrylate-backbone liquid crystal polymers and polymethacrylate-backbone liquid crystal polymers wherein R is hydrogen or methyl; n is an integer of 3 through 12; W represents a chemical bond, —O—, —CO$_2$— or —NR'—; m is equal to 0 or 1; Xs are the same or different and each represents a chemical bond, —O—, —S—, —CH$_2$—, —NR'—, —CO$_2$—, —CH=CH—, —N=CH—, —CH=CH—, —N=N— or the like; Ys are the same or different and each represents hydrogen, alkyl, alkoxy, halogen, cyano, nitro, phenyl or the like; l is an integer of 0 through 4; p is an integer of 0 through 3; Z is hydrogen, alkyl, alkoxy, halogen, cyano or nitro; and R' is hydrogen or alkyl.

(2) Polysiloxane-backbone liquid crystal polymers wherein n is an integer of 3 through 12; W represents a chemical bond, —O—, —CO$_2$— or —NR'—; m is equal to 0 or 1; Xs are the same or different and each represents a chemical bond, —O—, —S—, —CH$_2$—, —NR'—, —CO$_2$—, —CH=N—, —N=CH—, —CH=CH—, —N=N— or the like; Ys are the same or different and each represents hydrogen, alkyl, alkoxy, halogen, cyano, nitro, phenyl or the like; l is an integer of 0 through 4; p is an integer of 0 through 3; Z is hydrogen, alkyl, alkoxy, halogen, cyano or nitro; and R' is hydrogen or alkyl.

(3) Polyvinyl ether-backbone liquid crystal polymers wherein n is an integer of 3 through 12; W is a chemical bond, —O—, —CO$_2$— or —NR'—; m is equal to 0 or 1; Xs are the same or different and each represents a chemical bond, —O—, —S—, —CH$_2$—, —NR'—, —CO$_2$—, —CH=N—, —N=CH—, —CH=CH—, —N=N— or the like; Ys are the same or different and each represents hydrogen, alkyl, alkoxy, halogen, cyano, nitro, phenyl or the like; l is an integer of 0 through 4; p is an integer of 0 through 3; Z is hydrogen, alkyl, alkoxy, halogen, cyano or nitro; and R' is hydrogen or alkyl.

The above-mentioned side chain liquid crystal polymers may partially contain, as side chain moieties, mesogen-free groups such as hydrogen, alkyl, phenyl or the like in addition to the above mesogen groups.

The number of repeating units of the liquid crystal polymer used in the practice of the invention is generally in the range of 10 to 500.

In accordance with the invention, any of the above-mentioned liquid crystal polymers can be employed but the use of a liquid crystal polymer having a glass transition temperature, or a transition temperature from crystalline phase to optically anisotropic melt phase, of 20° C. or higher, preferably of 30° C. or higher, is conducive to an enhanced long-term functional stability of the oriented product. Furthermore, the use of a liquid crystal polymer whose transition temperature from optically anisotropic melt phase to optically isotropic melt phase is not more than 350° C. is preferred in terms of the thermal stability of the liquid crystal polymer at application of an electric field.

The term 'pulsating electric field' as used herein means an electric field which is predominantly unidirectional and whose magnitude varies periodically or non-periodically. Typically the following three kinds of pulsating field can be applied: (1) a field corresponding to an alternating one from which either the plus component or the minus component has been trimmed off as typically illustrated in FIG. 1; (2) a field corresponding to an alternating one in which either the plus component or the minus component has been transferred to the other component side as typically illustrated in FIG. 2; and (3) a field corresponding to an alternating one biased by a given amount as typically represented by the waveform shown in FIG. 3.

Figure 4:
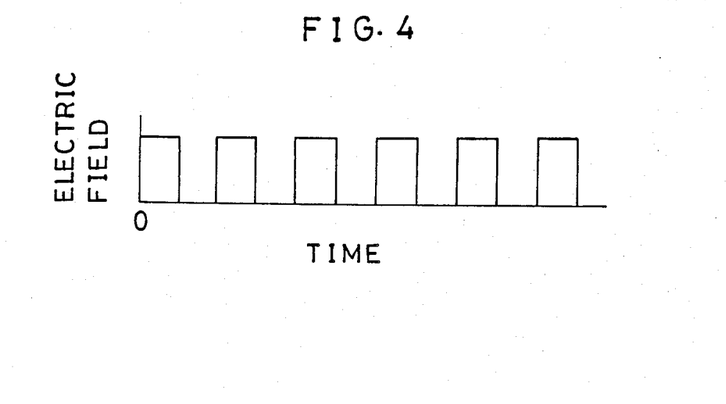
Figure 5:
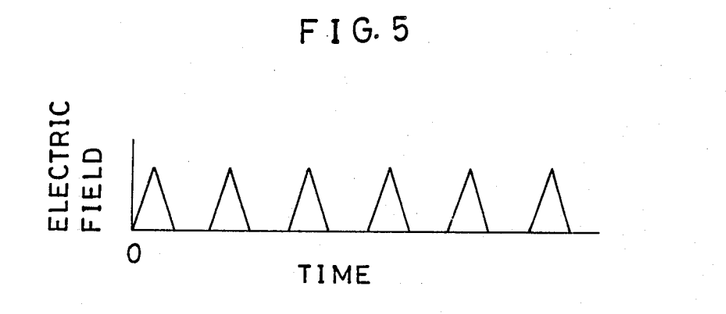

There is no particular limitation on the waveform that can be used in any of the above-mentioned pulsating electric fields. For example, one may use an alternating field modified by intermittent application of DC, such as the one shown in FIG. 4, in lieu of the sine wave shown in FIG. 1 or use an alternating field corresponding to a triangular waveform such as illustrated in FIG. 5.

The maximum electric field strength is not less than $10^3$ V/cm and preferably not less than $10^4$ V/cm, where the voltage achieving the maximum field strength is the peak of pulsating voltage applied The frequency of the pulsating electric field used in the practice of the invention is not less than 10 Hz and preferably not less than 50 Hz. Though there is no critical upper limit to the usable frequency of the pulsating electric field, it is practical to use a frequency of not more than 50 KHz. The frequency of a pulsating field is the number of repetitions of the waveform per second just as in the case of an alternating current.

For the purpose of altering the orientation of liquid crystal molecules with a pulsating electric field, there are the optimum strength and frequency thereof according to the structure of the liquid crystal polymer used and such optimum conditions can be easily found within the above-mentioned ranges by a few trials.

The application of a pulsating electric field according to the invention is preferably carried out within the temperature range in which the liquid crystal polymer used will form an optically anisotropic melt phase This temperature range of optically anisotropic melt phase can be determined by the following procedure. Thus, a sample film, preferably with a thickness of about 5 μm to 100 μm, is heated at a constant rate, generally at a rate of 5° to 20° C./minute, and its transmission of light is observed with a polarizing microscope using a crossed Nicol prism. The range from the temperature at which the amount of transmitted light begins to increase to the temperature at which the incident light ceases to be transmitted to give a dark field of view can be regarded as the temperature range of optically anisotropic melt phase. If the polarizing microscope is provided with a photomultiplier tube for quantitation of light transmitted through the sample film, the above observation will be more facilitated.

The application of a pulsating electric field according to the invention may also be performed in the temperature range in which the liquid crystal polymer forms an optically isotropic melt phase and, then, with the application of the pulsating field fixed being continued, the temperature of the liquid crystal polymer be reduced to room temperature.

It is also one of preferred embodiments of the invention to apply the pulsating field in the temperature range wherein both the optically anisotropic phase and isotropic phase of the liquid crystal polymer are coexistent.

The duration of application of said pulsating field at a given temperature within the above-mentioned temperature range is dependent on the magnitude and frequency of voltage used, temperature, the structure of the liquid crystal polymer and other variables but is generally in the range of 0.01 second to 100 hours, preferably 1 second to 10 hours, and still more desirably 10 seconds to 1 hour.

In the practice of the invention, it is preferable to first process the liquid crystal polymer into a shaped article and then subject it to a pulsating electric field. The term 'shaped article' as used herein is any product that can be prepared by a conventional molding technique such as injection molding, melt extrusion, hot-press method, etc. or a more recent solution molding technique which comprises casting or spin-coating of a solution of the liquid crystal polymer in a suitable solvent. The shaped article is preferably a film or sheet of small thickness, for example ranging from about 1 $\mu$m to 1 mm.

The procedure for application of said pulsating electric field is described below in detail.

A conductor is used as the electrode for use in the electric field orientation of a liquid crystal polymer. Specifically, copper, gold, platinum, and other metals, indium oxide, tin oxide and other transparent conductors can be employed. Such a conductor may be used as molded directly into a plate or roll, or as formed in a thin layer on a glass or other substrate. For example, a transparent electrode of indium oxide or tin oxide can be formed on a glass substrate by sputtering or the like technique. The present invention is compatible with both of the above forms and any of the electrode materials mentioned.

In the electric field orientation method of the invention, it is advantageous to provide at least one of the electrodes with an insulating layer. Such insulating layer may be made of organic material or inorganic material. To be specific, use can be made of polymer materials such as polyimides, Teflon, polyesters, etc., inorganic materials such as quartz, mica, etc., or mixtures of such materials. While any of these materials can be used for the purposes of the invention, it is preferable to select a material with high resistance to applied electric field. Furthermore, where the transition temperature to optically anisotropic melt phase is high, e.g. more than 100° C., it is preferable to use a heat-resistant material for the formation of said insulating layer. The thickness of the insulating layer is virtually optional but is preferably thin in order that the field strength to be applied to work may be increased. To be specific, the insulating layer is not more than 2 mm thick, preferably not more than 1mm thick, and more desirably not more than 500 $\mu$m. Most desirably, the insulating layer is not more than 200 $\mu$m thick. The effect of the insulating layer is sufficient only if it is provided for either one of the electrodes. By utilizing the above technique, a sufficient electric field can be applied even to a liquid crystal polymer whose breakdown voltage is lower than the voltage required for orientation.

After completion of the application of a pulsating electric field within the above-defined temperature range, the liquid crystal polymer is cooled to room temperature, whereby a shaped article oriented in one direction and polarized is obtained. Throughout the cooling process, the application of the pulsating electric field is maintained until the material reaches room temperature. However, the application of the field may be terminated when the liquid crystal material has been cooled to a temperature at which the relaxation of orientation of liquid crystal molecules can hardly occur any longer. Furthermore, if the liquid crystal polymer is quenched to a temperature at which no relaxation of orientation will take place, the application of the pulsating electric field need not be continued. The cooling rate is optional but generally 0.01° C. to 200° C./minute and preferably 0.1° C. to 200° C./minute. Where the application of the pulsating electric field is carried out in the temperature range wherein the liquid crystal polymer forms an optically isotropic melt phase, the polymer is preferably cooled at a rate of 0.1° C. to 25° C./minute in order that the liquid crystal polymer may be exposed to the electric field for a longer time within said temperature range wherein the polymer forms an optically anisotropic melt phase.

By the above-described method of the invention, there is obtained a product article oriented in the direction of the electric field. The degree of orientation or order parameter of this oriented article can be determined by a technique well known to those skilled in the art, such as X-ray diffraction analysis or electron spin resonance (ESR) analysis.

Where the liquid crystal polymer is a nematic liquid crystal, the degree of orientation should generally be 0.2 to 0.6, while the usual degree of orientation of a smectic liquid crystal is 0.6 to 1.0.

The oriented film obtainable by the method of the invention has several characteristics which are not possessed by the conventional oriented films produced by application of an alternating electric field. By way of illustration, the oriented film according to the invention shows piezoelectric properties, generating an electric potential upon application of an external impact. It has an ability to transform a sound into a voltage, too. The piezoelectric properties of this oriented film are considerably superior to those of the conventional piezoelectric elements made of polymer materials such as polyvinylidene fluoride or vinylidene cyanide-vinyl acetate copolymer and are comparable to the piezoelectric characteristics of piezoelectric elements of inorganic materials such as PZT.

The oriented film according to the invention has pyroelectric properties as well, and generating electricity upon thermal change.

Moreover, when the thermally stimulated depolarization current of the oriented film according to the invention was measured as described in the working examples given hereinafter, there was observed a current of charge due to depolarization at temperatures higher than a certain temperature. The amount of thermally stimulated depolarization current can be determined, for example, by the method described in Asakura Electric and Electronic Engineering Series Vol. 10, Physical Engineering of Electrical Materials (Taro Hino, Asakura Shoten, 1985) at page 98. When the thermally stimulated depolarization current was measured using a 20 μm-thick film of liquid crystal polymer according to the invention as an example, it generally had a charge of at least $10^{-8}$ coulombs/cm$^2$. It was thus confirmed that the oriented film has a surface charge and is an electret.

Based on the above results, it was presumed that unlike the oriented film obtainable by the conventional AC orientation method, the oriented film obtainable by the method of the invention has been oriented non-symmetrically.

The oriented film obtainable by the method of the invention is not only unidirectionally oriented but also polarized and since it has no center of symmetry, it can be used as a non-linear optical element as well. For example, a liquid crystal polymer obtainable by doping a liquid crystal polymer with a compound showing a nonlinear optical characteristic such as 2-nitroaniline, 4-nitroaniline, 2-aminophenol, 1-nitro-4-methylbenzene 4-cyanoaniline, 4-(dimethylamino)-4'-nitrostilbene or the like or a liquid crystal copolymer containing a derivative of such a compound in part of the side chain moiety can be oriented by the method of the invention to provide a product showing very remarkable nonlinear optical characteristics.

Thus, by the above-described electric field orientation method of the invention, there can be obtained unidirectionally oriented and polarized shaped articles of liquid crystal polymer These oriented articles can be utilized as electret materials, piezoelectric materials, pyroelectric materials, nonlinear optical elements, and various optical elements.

DETAILED DESCRIPTION OF PREFERRED EMBODIMENTS

The following examples illustrate the present invention in further detail but are by no means limitative of the scope of the invention.

EXAMPLE 1

A siloxane-backbone side chain type liquid crystal polymer was synthesized from 2.25 g of 4-(ω-octenoyloxy)-4'-cyanobinphenyl, 7.75 g of [p-(methoxy)phenyl] 4-(ω-octenoyloxy)benzoate and 1.67 g of polymethylhydrosiloxane (average number of repeating units: 40) in toluene (solvent) in the presence of chloroplatinic acid (catalyst). $^1$H-NMR spectrum revealed that the structure of the polymer obtained could be represented on the average by the following formula:

$l \approx 10$
$n \approx 26$
$m \approx 4$

A thin film (10 μm thickness) of this polymer was observed under a polarizing microscope (crossed Nicol prisms) equipped with a heater (Linkam model TH-600). When the temperature reached about 133° C., the polarized light transmission began to increase. At about 150° C., said transmission increased sharply, reached a maximum at 162° C. and then began to decrease. The polymer was quite isotropic optically at 190° C. Upon differential scanning calorimetry (DSC), two endothermic peaks were observed at 52° C. and 152° C. In consideration of results of X-ray analysis as well as the above results, it can be concluded that the crystalline-to-smectic transition temperature of this polymer is 52° C. and the smectic-to-isotropic transition temperature is 152° C.

Figure 6:
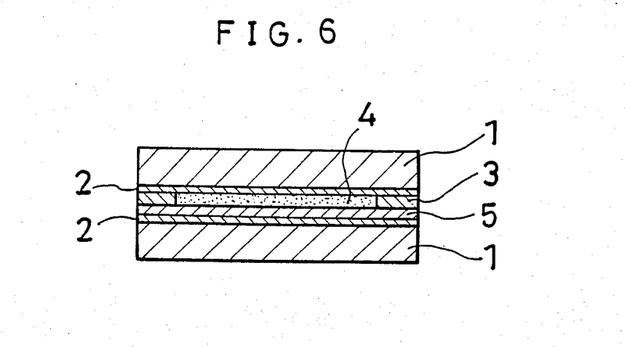
FIG. 6 is a cross-section view showing the cell used for application of a pulsating electric field to a liquid crystal polymer.
Figure 7:
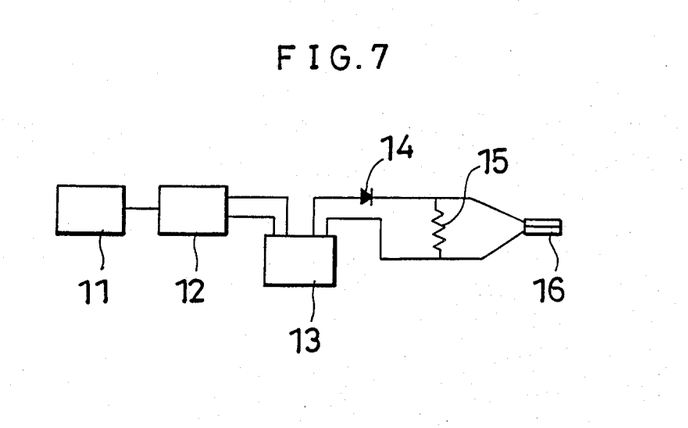
FIG. 7 is a schematic view showing an apparatus for generating a pulsating electric field.

The liquid crystal polymer was hot-pressed to a 20 μm-thick film and a cell was assembled using said film, as shown in FIG. 6. Said cell had a 20 μm-thick polyimide film spacer (3) and a 7.5 μm-thick polyimide film insulating film (5) combinedly sandwiched between 0.5 μm-thick glass sheets (hereinafter referred to as ITO glass sheets) (1) each having a transparent electrode (NESA) (2). The liquid crystal polymer film is indicated by the reference numeral 4. This cell was connected via conducting wires to an external power source (not shown). The cell was heated to 150° C. under observation under a polarizing microscope (crossed Nicol prisms) and a pulsating electric field having the waveform shown in FIG. 1 was applied thereto (maximum voltage 1,000 V, frequency 3.5 KHz). The bright field of view instantaneously turned to a dark field, whereby it was indicated that the orientation of the liquid crystal polymer had changed. The apparatus used for obtaining such pulsating field is schematically shown in FIG. 7. Thus, the sine wave signal from a function generator (11) was amplified to a peak-to-peak voltage of 20 V by means of an amplifier (12) and then further boosted to a peak-to-peak voltage of 2,000 V by means of a booster (13). The thus-obtained 2,000 V AC sine wave voltage was rectified by means of a high-voltage-resistant diode (14). The circuit contained a 500 KΩ resistance (15) which was connected in parallel with the cell (16). After 15 minutes of application of the pulsating field, the cell was cooled to room temperature rapidly at a rate of 60° C. per minute under continued application of said electric field.

The insulating film (5) was then removed from the cell shown in FIG. 6. The liquid crystal polymer film (4) obtained was apparently transparent and, when it was observed under a polarizing microscope (crossed Nicol prisms), the field of view was dark. Measurement of this oriented film for surface charge on a Shimadzu model SM-3 static monitor confirmed that its surface had an electric charge

Figure 8:
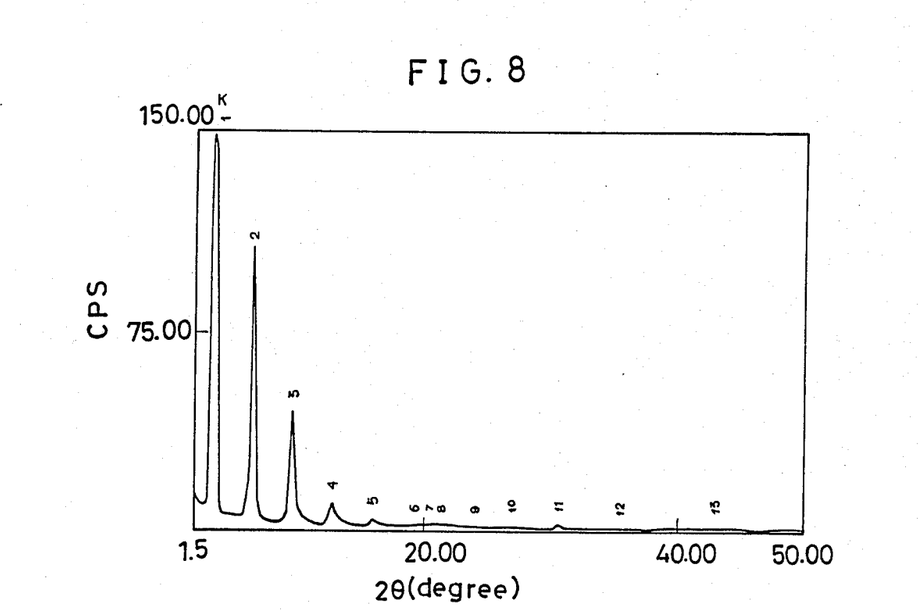
FIG. 8 is an X-ray diffraction pattern of the oriented liquid crystal polymer of Example 1.

The state of orientation of this oriented film was examined by X-ray diffractometry. An X-ray diffractogram obtained by using a Rigaku Denki model RAD-rA diffractometer is shown in FIG. 8. Based on the data shown there, it was concluded that the liquid crystal phase was a smectic one, and the interlayer distance in the liquid crystal phase was calculated to be 28.5 Å. Further X-ray diffractometry was performed with the direction of X-ray incidence and the detector being fixedly set to the diffraction peak of $2\theta = 3.1$ Å (corresponding to the interlayer distance of 28.5 Å) and, as a result, the degree of orientation of the oriented film was calculated to be 0.87.

Figure 9:
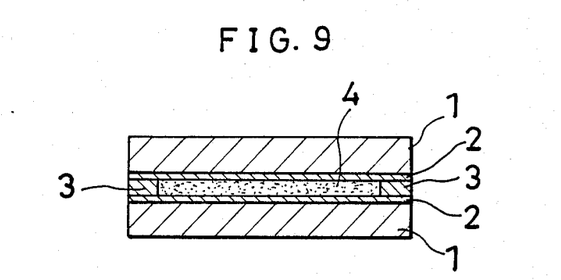
FIG. 9 is a cross-section view showing the cell used for measuring the voltage generated in the oriented film upon application of an impact.
Figure 10:
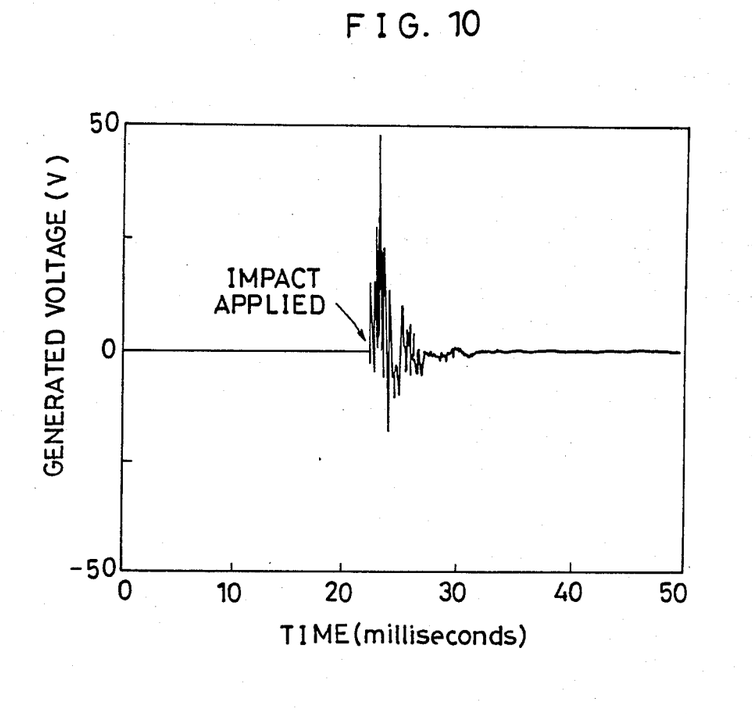
FIG. 10 is a diagram representing the voltage induced in the oriented liquid crystal polymer of Example 1 upon application of an impact.

The piezoelectric property of the oriented film thus obtained was evaluated as an example of its functions in the following manner. Thus, a 1-cm$^2$ specimen was excised from the 20 μm-thick liquid crystal polymer obtained by the above-mentioned method and directly sandwiched between the ITO glass sheets to give a cell for generated voltage measurement, as shown in FIG. 9. In said figure, the numeral 1 indicates a glass sheet, 2 a transparent electrode (NESA), 3 a 20 μm-thick spacer, and 4 the oriented liquid crystal polymer film. Thereafter, a cylindrical metal weight (6 g) having a base area of 1 cm$^2$ was allowed to fall down onto the cell from a distance of 20 cm and the electric potential generated was measured using a voltmeter (Yokogawa Electric function memory 3655) having an impedance of 1 megaohm (MΩ) in a manner such that data intake took place at a frequency of one per 0.1 millisecond. The results thus obtained are shown in FIG. 10. FIG. 10 indicates that said 20 μm-thick oriented liquid crystal polymer film generated an electric potential of about 50 V under these measurement conditions.

EXAMPLE 2

A siloxane-backbone side chain type liquid crystal polymer was synthesized from 4-(ω-octenoyloxy)-4'-cyanobiphenyl, [p-(n-hexyloxy)phenyl]-4-(2-propenyloxy)benzoate and polymethylhydrosiloxane (average number of repeating units: 40) in the same manner as in Example 1. It had the following structural formula:

$l \approx 9$ $n \approx 27$ $m \approx 4$

In DSC of this liquid crystal polymer, an endothermic peak due to crystalline to optically anisotropic melt phase transition was observed at 65° C. and an endothermic peak due to optically anisotropic melt phase to isotropic melt phase transition was observed at 162° C.

This polymer was formed into a thin film in the same manner as in Example 1. To this film was applied a pulsating electric field having the waveform shown in FIG. 2 (maximum voltage 1,000 V, frequency 3.5 KHz) at 155° C. for 30 minutes in the same manner as in Example 1 and, then, said cell was cooled to room temperature at a rate of 50° C. per minute under continued application of said electric field.

The thus-obtained film was subjected to X-ray diffractometry in the same manner as in Example 1. It was found that the film had been highly oriented, with a sharp primary peak being observed at $2\theta = 3.2$ Å.

A 1-cm$^2$ specimen of this oriented film was measured for thermally stimulated depolarization current within the temperature range of 20° C. to 300° C. Said charge was thus found to be $5 \times 10^{-7}$ coulombs.

The electric potential generated upon application of impact to the oriented film was measured in the same manner as in Example 1 and found to be about 50 V.

EXAMPLE 3

A siloxane-backbone side chain type liquid crystal polymer was synthesized from 4-(ω-octenoyloxy)-4'-cyanobiphenyl and [p-(hexyloxy)phenyl]-4-(2-propenyloxy)benzoate (in equimolar amounts) and polymethylhydrosiloxane (average number of repeating units: 40). It had the following structural formula:

l ≈ 18
m ≈ 18
n ≈ 4

A thin film of this polymer was observed under a polarizing microscope in the same manner as in Example 1. The transmission of light began to increase rapidly at 170° C., reached a maximum at 200° C. and then rapidly decreased. At 220° C., the field of view was completely dark. In DSC of this polymer, a glass transition temperature was observed at 35° C., an endothermic peak due to crystalline to optically anisotropic melt phase transition was observed at 65° C. and an endothermic peak due to optically anisotropic melt phase to isotropic melt phase transition was observed at 199° C.

Figure 2:
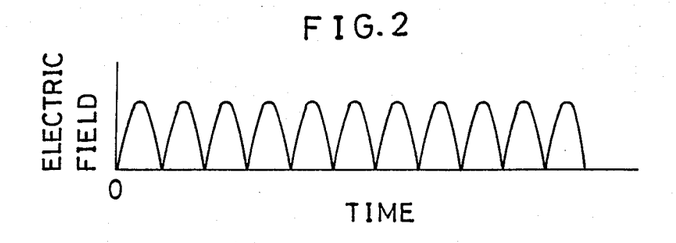
Figure 3:
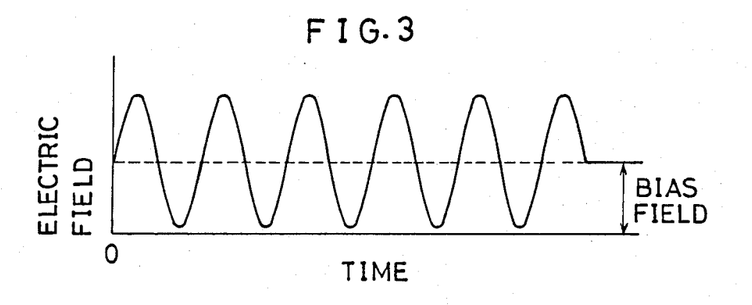

The same apparatus as used in Example 1 was used to apply a pulsating electric field having the waveform shown in FIG. 2 (maximum voltage 1,000 V, frequency 500 Hz) to a thin film of the above polymer at 225° C. The film was then cooled to room temperature at a rate of 0.5° C. per minute under continued application of said electric field. An apparently transparent film was obtained. This film was measured for surface charge in the same manner as in Example 1 and it was confirmed that the film surface occurred as an electret.

X-ray diffractometry confirmed that said film had been highly oriented. In thermally stimulated depolarization current measurement, which was carried out in the same manner as in Example 2, a charge flow due to depolarization was observed at about 170° C. and above.

EXAMPLE 4

A siloxane-backbone side chain type liquid crystal polymer was synthesized from 4-(ω-octenoyloxy)-4'-cyanobiphenyl and polymethylhydrosiloxane (average number of repeating units: 40) in the same manner as in Example 1. It had the following structural formula:

A film of the above polymer was observed under a polarizing microscope (crossed Nicol prisms) in the same manner as in Example 1. The transmission of light rapidly began at 165° C., reached a maximum at 175° C. and then rapidly decreased. At 188° C., the field of view was completely dark. In DSC of this polymer, a glass transition temperature was observed at 6° C. and an endothermic peak due to optically anisotropic melt phase to isotropic melt phase transition was observed at 175° C.

Figure 1:
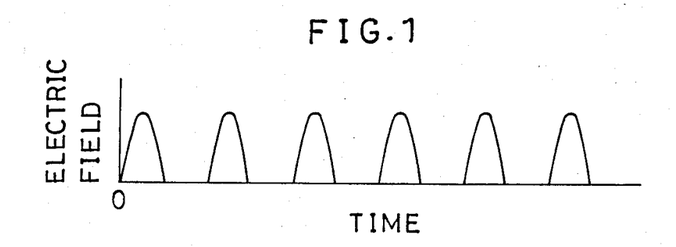
FIGS. 1 to 5 show the waveforms which can be used for the pulsating electric field according to the invention.

To a 20 μm-thick film of this liquid crystal polymer, there was applied a pulsating electric field having the waveform shown in FIG. 1 (maximum voltage 1,000 V, frequence 3 KHz) at 170° C. in the same manner as in Example 1. The bright field instantaneously turned to a dark field, whereby a change in orientation was indicated. After 5 minutes of pulsating field application, the cell was then cooled to room temperature rapidly at a rate of 100° C. per minute under continued application of the pulsating field.

After removal of the insulating film, the cell was observed. The oriented liquid crystal polymer film was apparently transparent. In observation under a polarizing microscope (crossed Nicol prisms), the field of view was dark. It was also confirmed that the surface of the oriented film had an electric charge.

The oriented liquid crystal polymer film obtained by the above procedure was evaluated for piezoelectric property in the same manner as in Example 1. A maximum electric potential of 30 V was generated.

EXAMPLE 5

A polymethacrylate-backbone side chain type liquid crystal polymer was synthesized by the method of European Polymer Journal, 18, 651 (1982). Thus, methacrylic acid was esterified with 4-(5-hydroxypentyloxy)-4'-cyanobiphenyl synthesized from 5-bromopentanol and 4-hydroxy-4'-cyanobiphenyl and the esterification product 4-[ω-(2-methylpropenoyloxy)pentyloxy]-4'-cyanobiphenyl was polymerized in benzene in the presence of 2,2'-azobisisobutyronitrile as an initiator. The liquid crystal polymer obtained had an average molecular weight of about 20,000 and its repeating unit was as follows:

Observation under a polarizing microscope and DSC, which were car reid out in the same manner as in Example 1, revealed that the glass transition temperature of the polymer was 63° C. and that the optically anisotropic melt phase to isotropic melt phase transition temperature was 120° C.

To a thin film of said polymer was applied a pulsating electric field having a triangular waveform at 120° C. for 30 minutes (maximum voltage 1,500 V, frequency 3 KHz) and the cell was cooled to room temperature under continued application of said electric field. An impact was given to the oriented polymer film in the same manner as in Example 1 and the electric potential then generated was measured to be about 40 V.

4-(Dimethylamino)-4'-nitrostilbene was added to the above polymer to an addition level of 2 weight percent and the mixture was homogenized at 150° C. and then cooled To the 4-(dimethylamino)-4'-nitrostilbene-doped polymer thus prepared, there was applied a pulsating electric field in the same manner as mentioned above. An apparently transparent, red-orange oriented film was obtained. This oriented film is useful as a non-linear optical element.

EXAMPLE 6

A main-chain type liquid crystal polymer representable by the repeating unit was synthesized from 40 mole percent of polyethylene terephthalate [intrinsic viscosity in phenol-tetrachloroethane (60/40 by volume): 0.60], 50 mole percent of 4-acetoxy-2-methoxybenzoic acid and 10 mole percent of 2-acetoxy-6-naphthoic acid by the melt polymerization method.

The inherent viscosity of the thus-obtained polymer as determined in pentafluorophenol at 60° C. was 0.217 dl/g.

When observed under a polarizing microscope, this polymer formed an optically anisotropic melt phase at 237° C. and above.

A pulsating electric field having the waveform shown in FIG. 1 was applied to a 20 μm-thick film of this polymer at 240° C. (maximum voltage 1,000 V, frequency 3 KHz) for 15 minutes in the same manner as in Example 1. The cell was cooled to 75° C. at a rate of 50° C. per minute under continued application of said electric field and then, without electric field application, allowed to cool to room temperature.

When measured in the same manner as in Example 1, the electric potential generated upon application of an impact to the oriented film of said polymer was 50 V at maximum.

COMPARATIVE EXAMPLE 1

An AC sine wave electric field (peak-to-peak voltage 2,000 V, frequency 3 KHz) was applied to a film of the polymer of Example 1 in place of the pulsating field. The field of view changed from bright to dark instantaneously. After 5 minutes of field application, the film was cooled rapidly to room temperature under continued application of said electric field. The film obtained. had no charge at all on its surface although it was optically transparent. Thus it was found that application of an alternating electric field can cause unidirectional orientation but cannot cause polarization. The above film was evaluated for piezoelectric property but failed to show any piezoelectric property.

COMPARATIVE EXAMPLE 2

A DC electric field was applied to a film of the polymer of Example 1 at a voltage of 1,000 V at 150° C. while observation was made under a polarizing microscope, whereupon turbulence of the liquid crystal polymer was observed. The film obtained after rapid cooling under continued application of the DC electric field was opaque.

What is claimed is:

1. A method for electric field orientation of liquid crystal polymers which comprises subjecting a liquid crystal polymer capable of forming an optically anisotropic melt phase to a pulsating electric field which is predominantly unidirectional and which has a frequency of not less than 10 Hz so that the molecules of said liquid crystal polymer are uniformly oriented and polarized.

2. A method for electric field orientation of liquid crystal polymers as claimed in claim 1, wherein the application of the pulsating electric field is performed within a temperature range in which one of the following states occurs:
   the liquid crystal polymer forms an optically anisotropic melt phase,
   said liquid crystal polymer forms an optically isotropic melt phase, and
   said liquid crystal polymer forms an otpically anisotropic melt phase and an isotropic melt phase which coexists with said optically anisotropic melt phase.

3. A method for electric field orientation of liquid crystal polymers as claimed in claim 2, wherein the application of the pulsating electric field is performed within the temperature range in which the liquid crystal polymer forms an optically anisotropic melt phase.

4. A method for electric field orientation of liquid crystal polymers as claimed in claim 2, wherein the application of the pulsating field is performed within the temperature range in which the liquid crystal polymer forms an optically isotropic melt phase.

5. A method for electric field orientation of liquid crystal polymers as claimed in claim 2, wherein the application of the pulsating electric field is performed within the temperature range in which both the optically anisotropic melt phase and isotropic melt phase of the liquid crystal polymer are coexistent.

6. A method for electric field orientation of liquid crystal polymers as claimed in claim 2, wherein after the application of the pulsating electric field is performed within said temperature range in which said one of said states occurs, the temperature of said liquid crystal polymer is reduced to room temperature, with the application of said pulsating electric field being continued during reducing of the temperature.

7. A method for electric field orientation of liquid polymers as claimed in claim 2, wherein after the application of the pulsating electric field is performed within the temperature range in which said one of said states occurs, the temperature of said liquid crystal polymer is reduced to a temperature at which the relaxation of orientation of liquid crystal molecules cannot substantially occur any longer, with the application of said pulsating electric field being continued during reducing of the temperature.

8. A method for electric field orientation of liquid crystal polymers as claimed in claim 1, wherein the maximum magnitude of the pulsating electric field applied is not less than $10^3$ V/cm.

9. A method for electric field orientation of liquid crystal polymers as claimed in claim 2, wherein the application of the pulsating electric field is performed at a given temperature within said temperature range for a period of 0.01 second to 100 hours.

10. A method for electric field orientation of liquid crystal polymers as claimed in claim 2, wherein the application of the pulsating electric field is performed at a given temperature within said temperature range performed for a period of 1 second to 10 hours.

11. A method for electric field orientation of liquid crystal polymers as claimed in claim 2, wherein the application of the pulsating electric field is performed at a given temperature within said temperature range for a period of 10 seconds to 1 hour.

12. A method for electric field orientation of liquid crystal polymers as claimed in claim 6 or 7, wherein the temperature of the liquid crystal polymer is reduced at a rate of 0.01° C. to 200° C. per minute.

13. A method for electric field orientation of liquid crystal polymers as claimed in claim 6 or 7, wherein the temperature of the liquid crystal polymer is reduced at a rate of 0.1° C. to 100° C. per minute.

14. A method for electric field orientation of liquid crystal polymers as claimed in claim 6 or 7, wherein the temperature of the liquid crystal polymer is reduced at a rate of 0.1° C. to 25° C. per minute.

15. A method for electric field orientation of liquid crystal polymers as claimed in claim 1, wherein the liquid crystal polymer is a side chain type liquid crystal polymer.

16. A method for electric field orientation of liquid crystal polymers as claimed in claim 1, wherein the liquid crystal polymer is a main chain type liquid crystal polymer.

17. A method for electric field orientation of liquid crystal polymers as claimed in claim 1, wherein, in applying the pulsating electric field, at least one of the electrodes is provided with an insulating layer.

18. A method for electric field orientation of liquid crystal polymers as claimed in claim 1, wherein the glass transition temperature or the crystalline-to-optically anisotropic melt phase transition temperature of the liquid crystal polymer is not lower than 20° C.

19. A method for electric field orientation of liquid crystal polymers as claimed in claim 1, wherein the glass transition temperature or the crystalline-to-optically anisotropic melt phase transition temperature of the liquid crystal polymer is not lower than 30° C.

20. A method for electric field orientation of liquid crystal polymers as claimed in claim 1, wherein the transition temperature from the optically anisotropic melt phase to the optically isotropic melt phase of the liquid crystal polymer is not higher than 350° C.

21. A method for electric field orientation of liquid crystal polymers as claimed in claim 1, wherein the liquid crystal polymer is processed in the form of a shaped article and the pulsating electric field is applied to the liquid crystal polymer processed in the form of a shaped article.

22. A method for electric field orientation of liquid crystal polymers as claimed in claim 21, wherein the liquid crystal polymer is in the form of a film or sheet.

23. An oriented, liquid crystal polymer as obtained by the method of claim 1.

24. An oriented liquid crystal polymer as claimed in claim 23, wherein the pulsating electric field is applied to the liquid crystal polymer in the form of a shaped article.

25. An oriented liquid crystal polymer as claimed in claim 24, wherein the liquid crystal polymer is in the form of a film or sheet.

* * * * *